United States Patent
Yang et al.

(10) Patent No.: US 12,400,842 B2
(45) Date of Patent: Aug. 26, 2025

(54) METHOD OF CLEANING CHAMBER COMPONENTS WITH METAL ETCH RESIDUES

(71) Applicant: Lam Research Corporation, Fremont, CA (US)

(72) Inventors: Wenbing Yang, Campbell, CA (US); Samantha SiamHwa Tan, Newark, CA (US); Ran Lin, Fremont, CA (US); Tamal Mukherjee, Fremont, CA (US); Chunhong Zhou, Fremont, CA (US); Xiaoyu Kang, Union City, CA (US); Yang Pan, Los Altos, CA (US); Hong Shih, Cupertino, CA (US)

(73) Assignee: Lam Research Corporation, Fremont, CA (US)

( * ) Notice: Subject to any disclaimer, the term of this patent is extended or adjusted under 35 U.S.C. 154(b) by 0 days.

(21) Appl. No.: 18/258,926

(22) PCT Filed: Dec. 6, 2021

(86) PCT No.: PCT/US2021/062044
§ 371 (c)(1),
(2) Date: Jun. 22, 2023

(87) PCT Pub. No.: WO2022/159183
PCT Pub. Date: Jul. 28, 2022

(65) Prior Publication Data
US 2024/0304428 A1    Sep. 12, 2024

Related U.S. Application Data

(60) Provisional application No. 63/139,231, filed on Jan. 19, 2021.

(51) Int. Cl.
*H01J 37/32* (2006.01)
*B08B 3/04* (2006.01)
(Continued)

(52) U.S. Cl.
CPC .......... *H01J 37/32862* (2013.01); *B08B 3/08* (2013.01); *B08B 9/08* (2013.01);
(Continued)

(58) Field of Classification Search
CPC .......... H01J 37/32862; C23C 16/4407; B08B 3/00–14; B08B 9/08–46; B08B 9/00–46; H01L 21/00–86
See application file for complete search history.

(56) References Cited

U.S. PATENT DOCUMENTS

| | | | |
|---|---|---|---|
| 7,107,998 B2 | 9/2006 | Greer et al. | |
| 7,546,840 B2 | 6/2009 | Hasebe et al. | |

(Continued)

FOREIGN PATENT DOCUMENTS

| | | |
|---|---|---|
| JP | 2000-200782 | 7/2000 |
| JP | 2001-284317 | 10/2001 |

(Continued)

OTHER PUBLICATIONS

International Search Report and Written Opinion from International Application No. PCT/US2021/062044 dated Apr. 7, 2022.

(Continued)

*Primary Examiner* — Michael E Barr
*Assistant Examiner* — Richard Z. Zhang
(74) *Attorney, Agent, or Firm* — Beyer Law Group LLP

(57) ABSTRACT

A method of cleaning residue containing ruthenium (Ru) residue on at least one surface of a component of a semiconductor processing chamber is provided. The residue is exposed to a Ru cleaning composition comprising at least one of hypochlorite and $O_3$ based chemistries, wherein the Ru cleaning composition removes the Ru residue.

11 Claims, 5 Drawing Sheets

(51) Int. Cl.
  *B08B 3/08*  (2006.01)
  *B08B 9/08*  (2006.01)
  *C11D 7/08*  (2006.01)
  *C11D 7/10*  (2006.01)
  *C11D 7/32*  (2006.01)
  *C11D 7/50*  (2006.01)
  *C23C 16/44* (2006.01)

(52) U.S. Cl.
  CPC .................. *C11D 7/08* (2013.01); *C11D 7/10* (2013.01); *C11D 7/3218* (2013.01); *C11D 7/5013* (2013.01); *C23C 16/4407* (2013.01); *B08B 3/04* (2013.01); *H01J 2237/022* (2013.01)

(56) References Cited

U.S. PATENT DOCUMENTS

| | | | |
|---|---|---|---|
| 9,257,638 | B2 | 2/2016 | Tan et al. |
| 10,767,257 | B2 | 9/2020 | Vitiello et al. |
| 2002/0066466 | A1* | 6/2002 | Tan ................. C23G 5/036 134/28 |
| 2003/0013314 | A1* | 1/2003 | Ying ............. H01L 21/32136 257/E21.311 |
| 2004/0144320 | A1* | 7/2004 | Hasebe ............ C23C 16/4404 118/724 |
| 2008/0121249 | A1* | 5/2008 | Gatineau ............. B08B 7/00 134/2 |
| 2010/0218788 | A1* | 9/2010 | Bao ................. C23C 16/4407 134/3 |
| 2015/0079786 | A1 | 3/2015 | Tan et al. |
| 2015/0280113 | A1* | 10/2015 | Tan ..................... C23F 1/12 438/3 |
| 2019/0185999 | A1 | 6/2019 | Shanbhag et al. |
| 2022/0203410 | A1* | 6/2022 | Scherer ............... B08B 3/047 |

FOREIGN PATENT DOCUMENTS

| | | |
|---|---|---|
| JP | 2001284317 A * | 10/2001 |
| JP | 2003-013232 | 1/2003 |
| JP | 2005-187880 | 7/2005 |
| JP | 2019-504929 | 2/2019 |
| JP | 2020-190014 | 11/2020 |
| WO | 2005-083523 | 9/2005 |

OTHER PUBLICATIONS

Wei Lin, Rong-Wei Zhang, Seung-Soon Jang, Ching-Ping Wong, and Jung-Il Hong. "'Organic Aqua Regia'—Powerful Liquids for Dissolving Noble Metals." Angewandte Chemie International Edition, Sep. 17, 2010.

Notice for Reason of Refusal from Japanese Application No. 2023-542480 dated Jun. 24, 2025 with Machine Translation.

Korean Office Action from Korean Application No. 10-2023-7028006 dated Jul. 24, 2025 with Machine Translation.

* cited by examiner

METHOD OF CLEANING CHAMBER COMPONENTS WITH METAL ETCH RESIDUES

CROSS-REFERENCE TO RELATED APPLICATION

This application claims the benefit of priority of U.S. Application No. 63/139,231, filed Jan. 19, 2021, which is incorporated herein by reference for all purposes.

BACKGROUND

The disclosure relates to a method of cleaning metal residues from components of a plasma processing chamber.

During semiconductor wafer processing, features may be etched through a metal containing layer. In the formation of magnetic random access memories (MRAM) or resistive random-access memory (RRAM) devices, a plurality of thin metal layers or films may be sequentially etched. For MRAM a plurality of thin metal layers may be used to form magnetic tunnel junction stacks. The thin metal layers may contain ruthenium (Ru) and other metals such as cobalt (Co), iron (Fe), palladium (Pd), nickel (Ni), boron (B), platinum (Pt), tantalum (Ta), molybdenum (Mo), titanium (Ti), manganese (Mn), magnesium (Mg), chromium (Cr), iridium (Ir), tungsten (W), copper (Cu), aluminum (Al), hafnium (Hf), indium (In), tin (Sn), gold (Au), and silver (Ag).

Such metal containing layers may be etched in a plasma processing chamber. Etch metal residues may deposit on plasma facing surfaces of components of the plasma processing chamber during the plasma etching process. Too much residue changes the performance of the chamber and may also create contaminants and may also make the component unusable. A change in the performance of the component may cause nonuniformities. Contaminants may cause the failure of devices being manufactured. If the component is unusable and must be replaced, a replacement component may be expensive.

The background description provided here is for the purpose of generally presenting the context of the disclosure. Information described in this background section, as well as aspects of the description that may not otherwise qualify as prior art at the time of filing, are neither expressly nor impliedly admitted as prior art against the present disclosure.

SUMMARY

To achieve the foregoing and in accordance with the purpose of the present disclosure, a method of cleaning residue containing ruthenium (Ru) residue on at least one surface of a component of a semiconductor processing chamber is provided. The residue is exposed to a Ru cleaning composition comprising at least one of hypochlorite and $O_3$ based chemistries, wherein the Ru cleaning composition removes the Ru residue.

In another manifestation, a method of cleaning residue comprising a noble metal residue from a component of a semiconductor processing chamber is provided. The noble metal residue is exposed to a noble metal cleaning composition comprising thionyl chloride and pyridine, wherein the noble metal cleaning composition removes the noble metal residue.

These and other features of the present disclosure will be described in more detail below in the detailed description and in conjunction with the following figures.

BRIEF DESCRIPTION OF THE DRAWINGS

The present disclosure is illustrated by way of example, and not by way of limitation, in the figures of the accompanying drawings and in which like reference numerals refer to similar elements and in which.

DETAILED DESCRIPTION OF THE PREFERRED EMBODIMENTS

Figure 1:
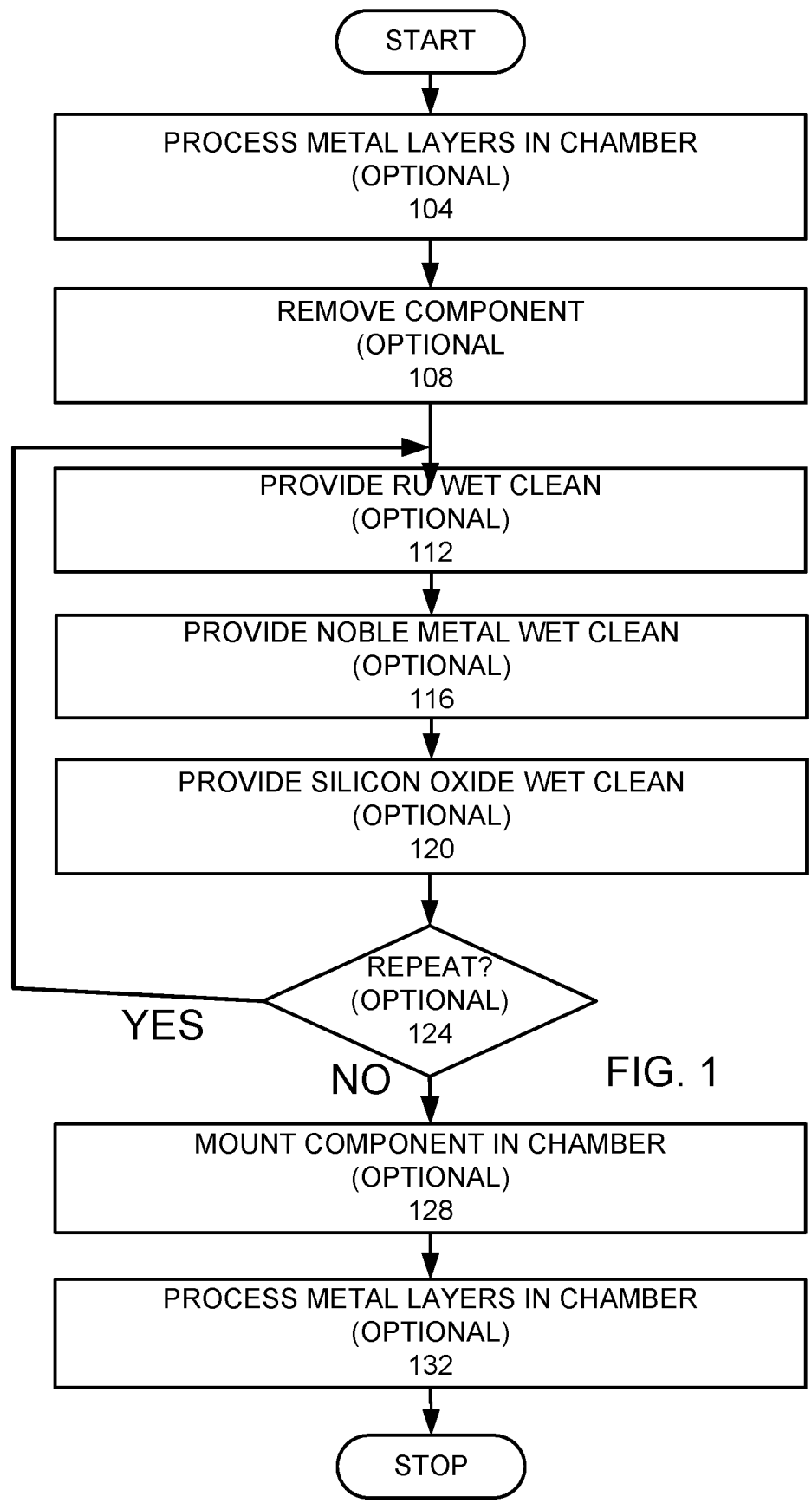
FIG. 1 is a high level flow chart of an embodiment.

The present disclosure will now be described in detail with reference to a few preferred embodiments thereof as illustrated in the accompanying drawings. In the following description, numerous specific details are set forth in order to provide a thorough understanding of the present disclosure. It will be apparent, however, to one skilled in the art, that the present disclosure may be practiced without some or all of these specific details. In other instances, well known process steps and/or structures have not been described in detail in order to not unnecessarily obscure the present disclosure.

During semiconductor wafer processing, features may be etched through a metal containing layer. In the formation of magnetic random access memories (MRAM) or resistive random-access memory (RRAM) devices, a plurality of thin metal layers or films may be sequentially etched. For MRAM a plurality of thin metal layers may be used to form magnetic tunnel junction stacks. The thin metal layers may contain ruthenium (Ru) and other metals such as cobalt (Co), iron (Fe), palladium (Pd), nickel (Ni), boron (B), platinum (Pt), tantalum (Ta), molybdenum (Mo), titanium (Ti), manganese (Mn), magnesium (Mg), chromium (Cr), iridium (Ir), tungsten (W), copper (Cu), aluminum (Al), hafnium (Hf), indium (In), tin (Sn), gold (Au), and silver (Ag). In various embodiments, the thin metal layers may comprise of Group III, IV, and V element metals (III-V metals).

Such metal containing layers may be processed, such as etched, in a plasma processing chamber. After a metal plasma etch, the plasma chamber components are contaminated with multiple etching species including metals in both metallic and compound form, and silicon species from process wafer or mask materials. Contaminants on the chamber wall will cause severe issues in integrated circuit (IC) fabrication by affecting chamber plasma conditions and thus wafer-to-wafer repeatability. For etching most metals in an MRAM magnetic tunnel junction (MTJ), halogen chemistry is applied to assess the etching efficacy. Metal containing residues from wafer processing are redeposited on chamber walls. X-ray photoelectron spectroscopy analysis of chamber wall surfaces reveals metals are mostly in compound form, such as metal fluoride (MFx, M: metal). In addition, the chamber wall surface is also coated with silicon oxide layers from the process wafer, hard mask materials, or etching chemicals. A mixture of metal/metal compounds and silicon oxide form contamination layers inside the chamber. This contamination results in several issues including flaking off metal particles onto wafers and process drifts by releasing multiple atoms from the chamber wall during wafer processing. Too much residue changes the performance of the chamber and may also create contaminants and may also make the component unusable. A change in the performance of the component may cause nonuniformities. Contaminants may cause the failure of devices being manufactured. If the component is unusable and must be replaced, a replacement component may be expensive.

If the residue cannot be cleaned from the component, the component must be discarded and replaced. Some of these residues are noble metal residue. Noble metals are metals that are highly resistant to chemical attack. Noble metals include Pd, Au, Ru, Pt, rhodium (Rh), osmium (Os), and iridium (Ir).

Figure 2A:
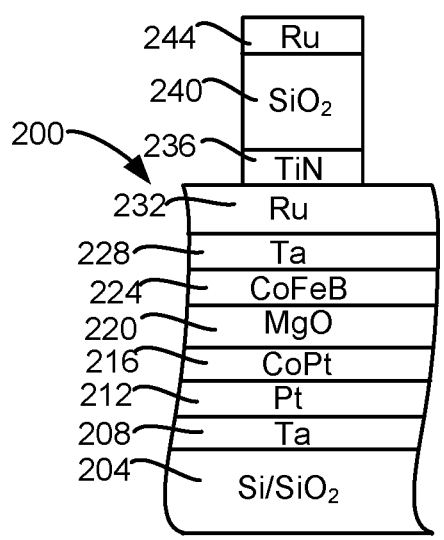
FIGS. 2A-B are schematic views of a stack processed in an embodiment.

Embodiments provide a method of cleaning components with metal residues of at least Ru and other noble metal residues. To facilitate understanding, FIG. 1 is a high level flow chart of a process used in an embodiment. Various embodiments may have more or less steps. In addition, in various embodiments the steps may be performed in different orders or simultaneously. Metal layers are processed in a chamber (104). One example chamber may be a plasma processing chamber. For example, the metal layers may form a stack on a wafer for providing an MRAM, RRAM, cobalt interconnects, etc. FIG. 2A is a schematic cross-sectional view of an example MRAM stack 200 on a process wafer that is processed in an embodiment. The stack 200 is on a substrate with a silicon or silicon oxide ($Si/SiO_2$) layer 204. A first tantalum (Ta) layer 208 is over the $Si/SiO_2$ layer 204. A platinum (Pt) layer 212 is over the first Ta layer 208. A cobalt platinum alloy (CoPt) layer 216 is over the Pt layer 212. A magnesium oxide (MgO) layer 220 is over the CoPt layer 216. A cobalt iron boron (CoFeB) layer 224 is over the MgO layer 220. A second Ta layer 228 is over the CoFeB layer 224. A ruthenium (Ru) layer 232 is over the second Ta layer 228. A patterned mask is formed over the stack 200. In this embodiment, the patterned mask comprises a titanium nitride layer 236, under a $SiO_2$ layer 240, under a Ru layer 244.

Figure 2B:
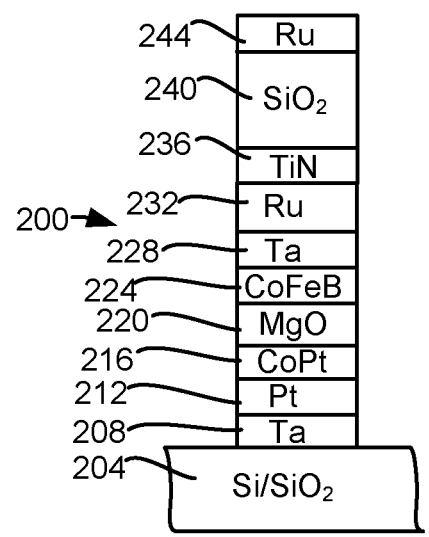

The stack 200 may be processed so that one or more of the metal containing layers are etched. To do so, the stack may be subjected to one or more etch processes. FIG. 2B is a schematic cross-sectional view of the stack 200 after an exemplary process is completed on of the stack 200. As shown, the processing of the stack has etched the first Ta layer 208, the Pt layer 212, the CoPt layer 216, the MgO layer 220, the CoFeB layer 224, the second Ta layer 228, and the Ru layer 232. Some of the patterned mask may also be etched.

As a result of the processing of the stack 200, materials from the Ru, $SiO_2$, TiN, CoFeB, MgO, CoPt, Pt, and/or Ta layers may be deposited on plasma facing surfaces of the plasma processing chamber. For example, as a result of the etch, residues of tantalum, beryllium, platinum, manganese, cobalt, iron, ruthenium, magnesium, titanium, and silicon are deposited on plasma facing surfaces of the chamber. After processing, the stack may be removed. This may be done by removing the wafer from the chamber. Subsequently, another stack on a wafer may be placed in the process chamber for processing. As each stack is etched, further coating of residues will form on the plasma facing surfaces of the chamber. In some embodiments, more than a thousand wafers are processed in the chamber.

Figure 3:
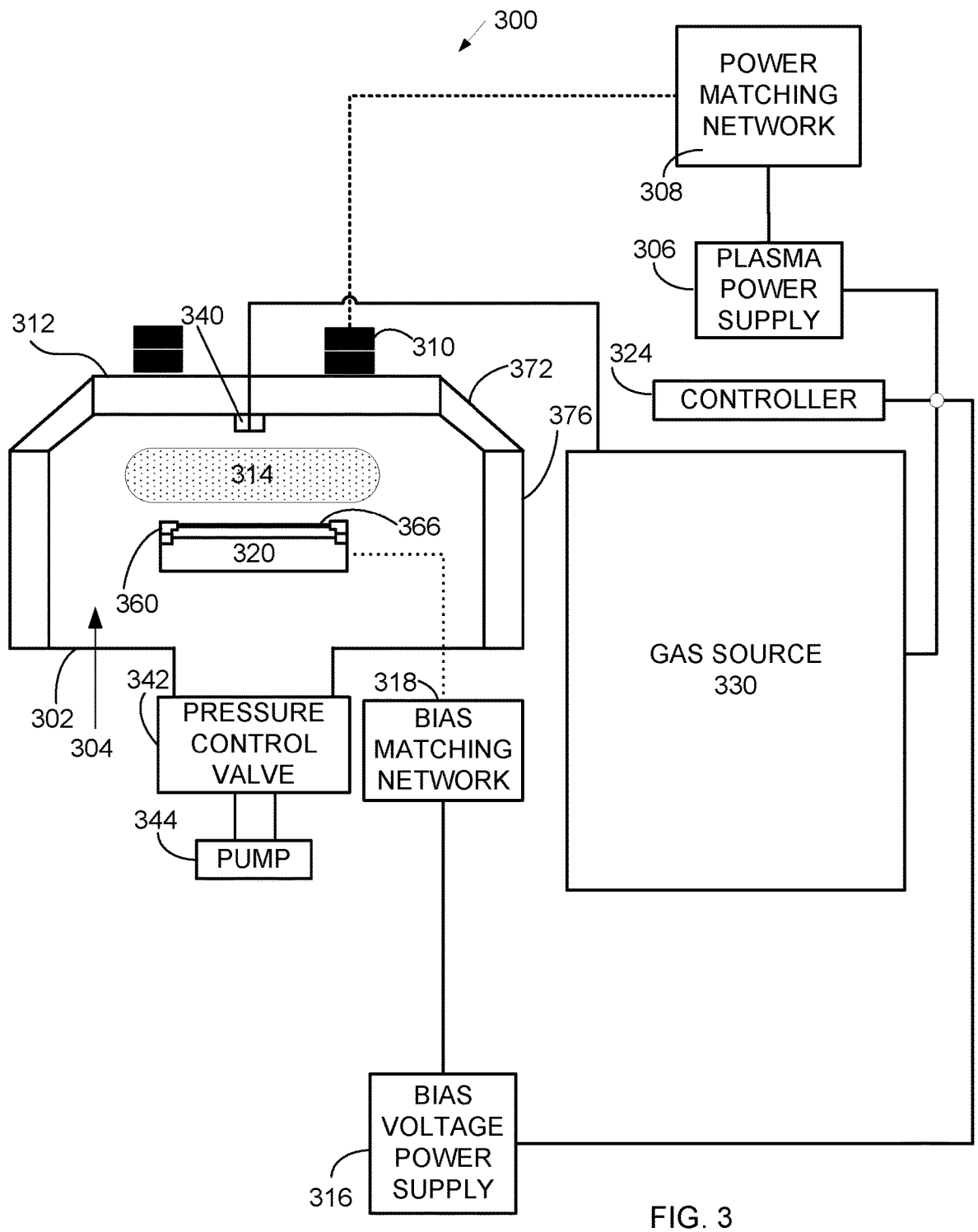
FIG. 3 is a schematic view of an etch reactor that may be used for etching.

In one embodiment, all processing may be performed in a single plasma etch chamber. In other embodiments, processing may be performed in different chambers. FIG. 3 schematically illustrates an example of a processing chamber system 300 that may be used in an embodiment. The processing chamber system 300 includes a plasma reactor 302 having a plasma processing chamber 304 therein. A plasma power supply 306, tuned by a power matching network 308, supplies power to a transformer coupled plasma (TCP) coil 310 located near a dielectric inductive power window 312 to create a plasma 314 in the plasma processing chamber 304 by providing an inductively coupled power. A pinnacle 372 extends from a chamber wall 376 of the plasma processing chamber 304 to the dielectric inductive power window 312 forming a pinnacle ring. The pinnacle 372 is angled with respect to the chamber wall 376 and the dielectric inductive power window 312. For example, the interior angle between the pinnacle 372 and the chamber wall 376 and the interior angle between the pinnacle 372 and the dielectric inductive power window 312 may each be greater than 90° and less than 180°. The pinnacle 372 provides an angled ring near the top of the plasma processing chamber 304, as shown. The TCP coil (upper power source) 310 may be configured to produce a uniform diffusion profile within the plasma processing chamber 304. For example, the TCP coil 310 may be configured to generate a toroidal power distribution in the plasma 314. The dielectric inductive power window 312 is provided to separate the TCP coil 310 from the plasma processing chamber 304 while allowing energy to pass from the TCP coil 310 to the plasma processing chamber 304. A wafer bias voltage power supply 316 tuned by a bias matching network 318 provides power to an electrode 320 to set the bias voltage when a stack is placed on the electrode 320. A cover 366 is placed over the electrode 320. In this embodiment, the cover 366 is a bare silicon wafer. A controller 324 controls the plasma power supply 306 and the wafer bias voltage power supply 316.

The plasma power supply 306 and the wafer bias voltage power supply 316 may be configured to operate at specific radio frequencies such as, for example, 13.56 megahertz (MHz), 27 MHz, 2 MHz, 60 MHz, 400 kilohertz (kHz), 2.54 gigahertz (GHz), or combinations thereof. Plasma power supply 306 and wafer bias voltage power supply 316 may be appropriately sized to supply a range of powers in order to achieve the desired process performance. For example, in one embodiment, the plasma power supply 306 may supply the power in a range of 50 to 5000 Watts, and the wafer bias voltage power supply 316 may supply a bias voltage in a range of 20 to 2000 volts (V). In addition, the TCP coil 310 and/or the electrode 320 may be comprised of two or more sub-coils or sub-electrodes. The sub-coils or sub-electrodes may be powered by a single power supply or powered by multiple power supplies.

As shown in FIG. 3, the processing chamber system 300 further includes a gas source/gas supply mechanism 330. The gas source 330 is in fluid connection with plasma processing chamber 304 through a gas inlet, such as a gas injector 340. The gas injector 340 may be located in any advantageous location in the plasma processing chamber 304 and may take any form for injecting gas. Preferably, however, the gas inlet may be configured to produce a "tunable" gas injection profile. The tunable gas injection profile allows independent adjustment of the respective flow of the gases to multiple zones in the plasma process chamber 304. More preferably, the gas injector is mounted to the dielectric inductive power window 312. The gas injector may be mounted on, mounted in, or form part of the power window. The process gases and by-products are removed from the plasma process chamber 304 via a pressure control valve 342 and a pump 344. The pressure control valve 342 and pump 344 also serve to maintain a particular pressure within the plasma processing chamber 304. The pressure control valve 342 can maintain a pressure of less than 1 torr during processing. An edge ring 360 is placed around a top part of the electrode 320. The gas source/gas supply mechanism 330 is controlled by the controller 324. For example, Kiyo® tools made by Lam Research Corp. of Fremont, CA, may be used to practice an embodiment.

Figure 4A:
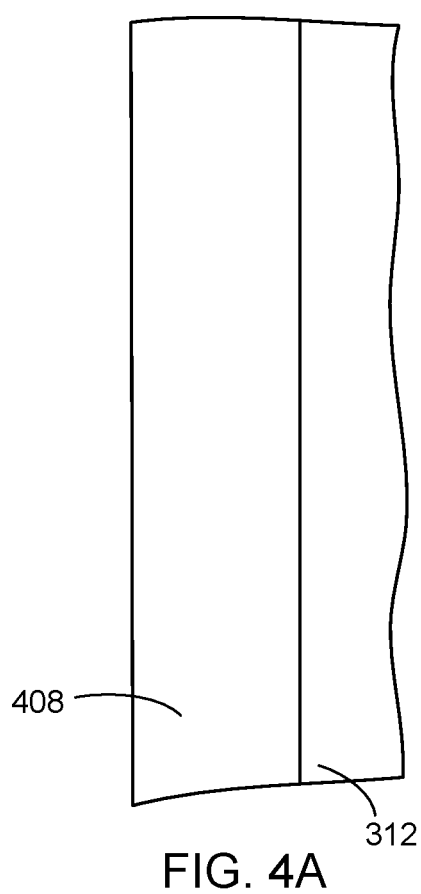
FIG. 4A is an enlarged cross-sectional view of part of a component of the plasma processing chamber with a residue layer.

When the performance of the component is sufficiently degraded or after a specified number of wafers is processed or after a specified time of usage passes, the component is removed from the chamber for cleaning (step 108). For example, the component may be removed after 300 radio frequency (RF) hours. RF hours is the amount of time that RF power is applied in the plasma chamber. FIG. 4A is an enlarged cross-sectional view of part of a component of the plasma processing chamber 304, shown in FIG. 3, such as the inductive power window 312 after the component has been removed. In this embodiment, processing the stacks deposits a residue layer 408 on plasma facing surfaces of the component. In this embodiment, the residue layer 408 comprises residues of tantalum, beryllium, platinum, manganese, cobalt, iron, ruthenium, magnesium, titanium, and silicon oxide. Of these residues, ruthenium and platinum are noble metals. In some embodiments, the residue layer 408 may be formed by thin layers of residues of different materials.

After the component is removed from the plasma processing chamber 304 a Ru clean process is provided (step 112). In an embodiment, the component is cleaned using at least one of hypochlorite and ozone ($O_3$). In various embodiments, the hypochlorite may be at least one of sodium hypochlorite (NaClO), ammonium hypochlorite ($NH_4ClO$), hydrogen hypochlorite (HClO). In some embodiments, the clean process may be a wet clean process, such as using a wet clean bath. For example, the wet clean bath may be an aqueous solution containing at least one of hypochlorite and ozone. In addition, the wet clean bath may further comprise ammonia. Although the Ru is described in this example, the composition may alternatively or additionally be used to clean residues containing other materials. In some embodiments, the cleaning may be performed while the component is in the chamber.

Figure 5:
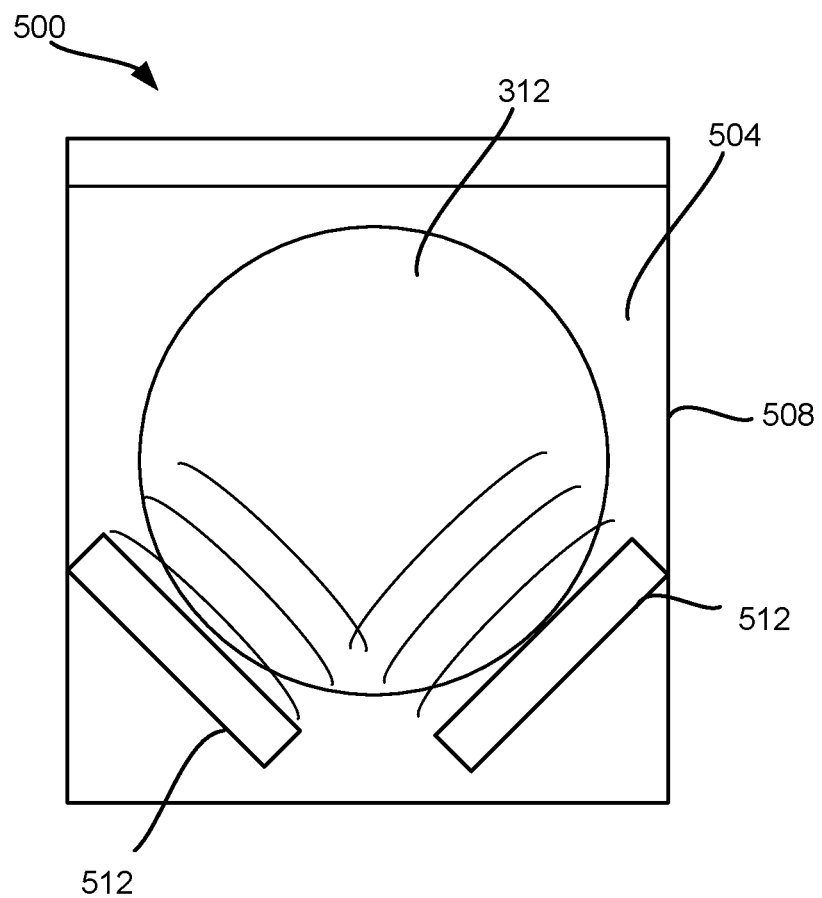
FIG. 5 schematic view of the component in a wet bath.

FIG. 5 is a schematic view of the component 312 in an exemplary Ru wet clean bath 500. The Ru wet clean bath comprises a Ru wet clean solution 504 comprising an aqueous solution of at least one of hypochlorite and ozone ($O_3$) with ammonia in a container 508. The residue layer 408 is exposed to the Ru wet clean solution 504. In this embodiment, transducers 512 are provided. The transducers 512 provide ultrasonic or megasonic energy in order to increase residue removal. The Ru wet clean bath 500 removes at least some of the Ru residue. The component is removed from the Ru wet clean bath 500. The component 312 is removed from the Ru wet clean bath 500.

A noble metal clean is provided (step 116). In an embodiment, the component is cleaned using a noble metal cleaning composition comprising a mixture of thionyl chloride and pyridine. In some embodiments, the clean process may be a wet clean process, such as using a wet clean bath. For example, the wet clean bath may be an aqueous solution containing thionyl chloride and pyridine in a solvent. The solution of a mixture of thionyl chloride and pyridine in a solvent is known as organic aqua regia. Organic aqua regia is known for dissolving some noble metals, such as palladium, gold, and platinum. However, organic aqua regia does not dissolve ruthenium, rhodium, iridium, and osmium. In some embodiments, the solvent may be at least one of acetonitrile ($CH_3CN$), dimethyl sulfoxide (DMSO), and dimethylformamide (DMF). Examples of the noble metal wet clean bath may be similar to the Ru wet clean bath 500, with the difference being that the noble metal wet clean bath contains a noble metal wet clean solution of a mixture of thionyl chloride and pyridine in a solvent, such as water. The residue layer 408 is exposed to the noble metal cleaning composition. The noble metal cleaning composition removes Pd and Pt containing residues. The component 312 is removed from the noble metal cleaning composition.

A silicon oxide clean is provided (step 120). In an embodiment, the component is placed in a silicon oxide wet clean bath comprising an acid and a passivating solution. In this example, the acid may be at least one of hydrofluoric acid (HF) and ammonium fluoride ($NH_4F$). The passivating solution may generally be an organic solvent chosen from at least one of the group of amines, alcohol, glycol, and acetone. For example, the passivating solution may be at least one of methylamine, ethyleneamine, ethylenediamine, diethylenetriamine, ethylene glycol, propylene glycol, and acetylacetone. The acid removes silicon oxide containing residue. The passivating solution protects the surface of the component. The silicon oxide wet clean bath may be similar to the Ru wet clean bath 500, with the difference being that the silicon oxide wet clean bath contains a silicon oxide wet clean solution. The residue layer 408 is exposed to the silicon oxide wet clean solution. The silicon oxide wet clean removes silicon oxide containing residues. The passivating solution passivates the surface of the component and prevents damaging of the texture applied on the parts. The component is removed from the silicon oxide wet clean bath.

In this embodiment, silicon oxide wet clean bath further comprises other acids to remove other metals. The other acid may be one or more of hydrochloric acid (HCl), nitric acid ($HNO_3$), and sulfuric acid ($H_2SO_4$). Such acids may be used to remove one or more of Ta, Ni, Co, Cr, Hf and III-V metals. In other embodiments, a separate bath of one or more of HCl, $HNO_3$, and $H_2SO_4$ may be used to remove one or more of Ta, Ni, Co, Cr, Hf and III-V metals before providing the silicon oxide wet clean bath.

Figure 4B:
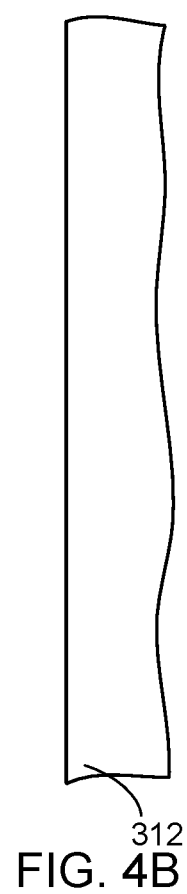
FIG. 4B is an enlarged cross-sectional view of part of the component after the residue layer has been removed.

The steps of providing a Ru wet clean (step 112), providing a noble metal wet clean (step 116), and providing a silicon oxide wet clean (step 120) may be repeated a plurality of times for a plurality of cycles (step 124). The residue layer 408 may comprise alternating layers of different residues. The alternating layers may be caused by the different wafers being sequentially etched for many different wafers. FIG. 4B is an enlarged cross-sectional view of part of a component 312 after the residue layer 408, shown in FIG. 4A, has been removed.

The component 312 is then mounted in a plasma processing chamber (step 128). The plasma processing chamber is used to process metal containing layers, such as etching metal containing layers (step 132).

The ability to clean metal containing residues from the component, allows for the component 312 to be reused, instead of requiring disposal of the component. Reuse of the component 312 reduces costs and waste, reduces contamination of devices being processed, and increases device uniformity. Various embodiments use organic aqua regia instead of regular aqua regia in order to reduce damage to the component surface.

In some embodiments, additional cleaning steps may be provided. For example, a deionized water rinse may be provided after any of the wet cleaning steps. In other embodiments, additional wet cleaning steps may be provided. Other cleaning processes may be added in other embodiments. For example, scrubbing or beam blasting may be provided in other embodiments.

In other embodiments, other steps may be provided after the component 312 is again mounted in a plasma processing chamber (step 128) and before using the component in the plasma processing chamber (step 132). For example, a plasma process may be used to condition or season the component 312.

In other embodiments, metal layers, such as a Ru containing layer may be used as a hardmask. Such embodiments may not have a step of etching a metal containing layer. However, residue from the Ru containing layer may be deposited on parts of the plasma processing chamber. Other embodiments may have other metal containing layers for other uses.

While this disclosure has been described in terms of several preferred embodiments, there are alterations, permutations, modifications, and various substitute equivalents, which fall within the scope of this disclosure. It should also be noted that there are many alternative ways of implementing the methods and apparatuses of the present disclosure. It is therefore intended that the following appended claims be interpreted as including all such alterations, permutations, and various substitute equivalents as fall within the true spirit and scope of the present disclosure.

What is claimed is:

1. A method of cleaning residue comprising ruthenium (Ru) residue, noble metal residue, and silicon oxide residue on at least one surface of a component of a semiconductor processing chamber, comprising:
   exposing the residue to a Ru cleaning composition comprising at least one of hypochlorite and O3 based chemistries, wherein the Ru cleaning composition removes the Ru residue; followed by
   exposing the residue to a noble metal cleaning composition comprising thionyl chloride and pyridine in a solvent, wherein the noble metal cleaning composition removes the noble metal residue; and followed by
   exposing the residue to a silicon oxide wet clean solution comprising an acid and a passivating solution, wherein the acid removes the silicon oxide residue and wherein the passivating solution passivates at least one surface of the component.

2. The method, as recited in claim 1, the exposing the residue to the Ru cleaning composition comprises immersing the component in a bath of the Ru cleaning composition.

3. The method, as recited in claim 1, wherein the Ru cleaning composition further comprises ammonia.

4. The method, as recited in claim 1, wherein the solvent is an organic solvent.

5. The method, as recited in claim 4, wherein the organic solvent is at least one of dimethyl sulfoxide and dimethylformamide.

6. The method, as recited in claim 1, wherein the exposing the residue to the Ru cleaning composition, the exposing the residue to the noble metal cleaning composition, and the exposing the residue to the silicon oxide wet clean solution are performed sequentially for a plurality of cycles.

7. The method, as recited in claim 1, wherein the acid of the silicon oxide wet clean solution, comprises at least one of hydrofluoric acid (HF) and ammonium fluoride ($NH_4F$).

8. The method, as recited in claim 7, wherein the passivating solution comprises at least one of methylamine, ethyleneamine, ethylenediamine, diethylenetriamine, and acetylacetone.

9. The method, as recited in claim 7, wherein the passivating solution comprises an organic solvent.

10. The method, as recited in claim 7, wherein the passivating solution comprises at least one of a group of amines and acetone.

11. The method, as recited in claim 1, wherein the Ru cleaning composition further comprises water.

* * * * *